(12) United States Patent
Higashi et al.

(10) Patent No.: US 12,009,810 B2
(45) Date of Patent: Jun. 11, 2024

(54) POWER SEMICONDUCTOR DEVICE

(71) Applicant: Mitsubishi Electric Corporation, Tokyo (JP)

(72) Inventors: Yukimasa Higashi, Tokyo (JP); Koji Yamamoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 211 days.

(21) Appl. No.: 17/780,169

(22) PCT Filed: Feb. 4, 2020

(86) PCT No.: PCT/JP2020/004009
§ 371 (c)(1),
(2) Date: May 26, 2022

(87) PCT Pub. No.: WO2021/156928
PCT Pub. Date: Aug. 12, 2021

(65) Prior Publication Data
US 2022/0416786 A1 Dec. 29, 2022

(51) Int. Cl.
*H03K 17/687* (2006.01)
*H01T 15/00* (2006.01)
*H02H 7/20* (2006.01)

(52) U.S. Cl.
CPC ......... *H03K 17/6872* (2013.01); *H01T 15/00* (2013.01); *H02H 7/20* (2013.01)

(58) Field of Classification Search
CPC ...... H03K 17/6872; F02P 3/055; F02P 9/002; H01T 15/00; H02H 7/20; Y02T 10/40
(Continued)

(56) References Cited

U.S. PATENT DOCUMENTS 4,774,924 A * 10/1988 Minks ..................... F02P 5/155
123/651
8,861,175 B2  10/2014 Godo et al.
(Continued)

FOREIGN PATENT DOCUMENTS

JP        5423378 B2    2/2014

OTHER PUBLICATIONS

International Search Report issued in PCT/JP2020/004009; dated Apr. 14, 2020.

*Primary Examiner* — Kevin J Comber
(74) *Attorney, Agent, or Firm* — Studebaker & Brackett PC

(57) ABSTRACT

The object of the present disclosure is to provide a power semiconductor device capable of miniaturization. According to the present disclosure power semiconductor device includes a semiconductor switching element configured to control a current flowing through a primary coil composing an ignition coil, and a control circuit configured to control drive of the semiconductor switching element, in which the control circuit includes a first constant current source, a first transistor with an output terminal thereof connected to a control terminal of the semiconductor switching element, a resistor with one end thereof connected to a control terminal of the first transistor and an other end thereof connected to the constant current source, a capacitor with one end thereof connected to the control terminal of the first transistor and an other end thereof grounded, and a second transistor with an input terminal thereof connected to the resistor and an output terminal grounded.

4 Claims, 8 Drawing Sheets

(58) Field of Classification Search
USPC .......................................................... 361/263
See application file for complete search history.

(56) References Cited

U.S. PATENT DOCUMENTS

| | | | | |
|---|---|---|---|---|
| 2004/0216724 | A1* | 11/2004 | Uruno | H01L 29/7395 |
| | | | | 257/E29.198 |
| 2011/0141651 | A1* | 6/2011 | Godo | F23Q 3/004 |
| | | | | 361/263 |
| 2018/0048139 | A1* | 2/2018 | Miyazawa | H02H 1/0007 |
| 2018/0062499 | A1* | 3/2018 | Yamamoto | F02P 3/055 |

* cited by examiner

F I G. 5
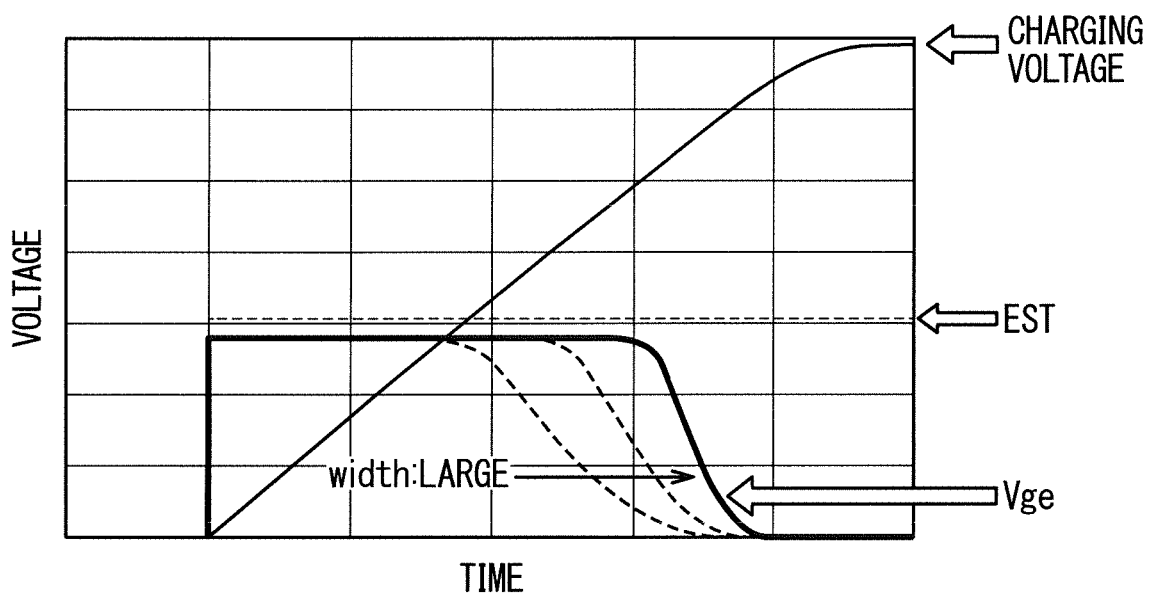

POWER SEMICONDUCTOR DEVICE

TECHNICAL FIELD

The present disclosure relates to a power semiconductor device used in an ignition system of an internal combustion engine.

BACKGROUND ART

A power semiconductor device that drives an ignition coil used in an ignition system of an internal combustion engine such as an automobile engine is equipped with a function of cutting off a load current when abnormal heat generation is detected, and a function of cutting off the load current when an ON-signal is continuously input for a certain period of time (hereinafter referred to as "over-energization cutting-off function"), as a protection function of the power semiconductor device.

The protection functions are an operation for self-protection of the power semiconductor device; therefore, the timing of cutting off the load current is performed regardless of the timing of the ignition signal by the Engine Control Unit (ECU). Therefore, depending on the cutting-off timing by the protection function, problems such as engine backfire or knocking may occur due to the timing of ignition being inappropriate in the ignition sequence.

As a countermeasure to the above problem, conventionally, the technology is disclosed (see, for example, Patent Document 1) in which the over-energization cutting-off function and a function of cutting off the load current gradually so that unintended ignition at the timing of cutting-off operation (hereinafter referred to as "gradual cutting-off function") is prevented are implemented.

In the over-energization cutting-off function disclosed in Patent Document 1, a capacitor is charged with a constant current source during a drive signal is being applied. Then, the charging voltage of the capacitor and the reference voltage are compared by a comparator circuit, and when the charging voltage exceeds the reference voltage, the drive current of the switching element is cut off through the operation.

Further, in the gradual cutting-off function disclosed in Patent Document 1, the electric charge accumulated in the gate capacitance of the switching element is discharged at a constant current value using a constant current source through the operation, when the above-mentioned over-energization cutting-off function is operated. Consequently, the gate voltage of the switching element can be gradually attenuated, and the load current can be gradually cut off.

PRIOR ART DOCUMENTS

Patent Documents

[Patent Document 1] Japanese Patent No. 5423378

SUMMARY

Problem to be Solved by the Invention

The power semiconductor device disclosed in Patent Document 1 has a problem that the circuit scale increases because it is required that the circuit for implementing the over-energization cutting-off function and the circuit for implementing the gradual cutting-off function are separately configured.

Further, when the gate capacitance of the insulated gate type switching element is used instead of the use of a large capacity capacitor as in the technique disclosed in Patent Document 1, there has been a problem that the controllability of the cutting-off time lowers because the gate capacitance being small makes it difficult to extend the cutting-off time for more than a certain value (more than several milliseconds). Therefore, the design degree of the cutting-off time is typically improved by providing a capacitor separate from the gate capacitance of the insulated gate type switching element. However, such a method requires the provision of one capacitor for each of the over-energization cutting-off function and the gradual cutting-off function, which has been an obstacle factor for downsizing of the power semiconductor device.

The present disclosure has been made to solve such a problem, and an object of the present disclosure is to provide a power semiconductor device capable of downsizing.

Means to Solve the Problem

According to the present disclosure power semiconductor device includes a semiconductor switching element configured to control a current flowing through a primary coil composing an ignition coil, and a control circuit configured to control drive of the semiconductor switching element, in which the control circuit includes a first constant current source, a first transistor with an output terminal thereof connected to a control terminal of the semiconductor switching element, a resistor with one end thereof connected to a control terminal of the first transistor and an other end thereof connected to the constant current source, a capacitor with one end thereof connected to the control terminal of the first transistor and an other end thereof grounded, and a second transistor with an input terminal thereof connected to the resistor and an output terminal grounded.

Effects of the Invention

According to the present disclosure power semiconductor device includes a semiconductor switching element, and a control circuit, in which the control circuit includes a first constant current source, a first transistor with an output terminal thereof connected to a control terminal of the semiconductor switching element, a resistor with one end thereof connected to a control terminal of the first transistor and an other end thereof connected to the constant current source, a capacitor with one end thereof connected to the control terminal of the first transistor and an other end thereof grounded, and a second transistor with an input terminal thereof connected to the resistor and an output terminal grounded; therefore, downsizing of the power semiconductor device is ensured.

The objects, features, aspects, and advantages of the present disclosure will become more apparent from the following detailed description and the accompanying drawings.

BRIEF DESCRIPTION OF DRAWINGS

FIG. 5 is a graph showing the relationship between the gate voltage of the IGBT 28 and the channel width of the PMOS 14 according to the first embodiment.

DESCRIPTION OF EMBODIMENT(S)

First Embodiment

Figure 1:
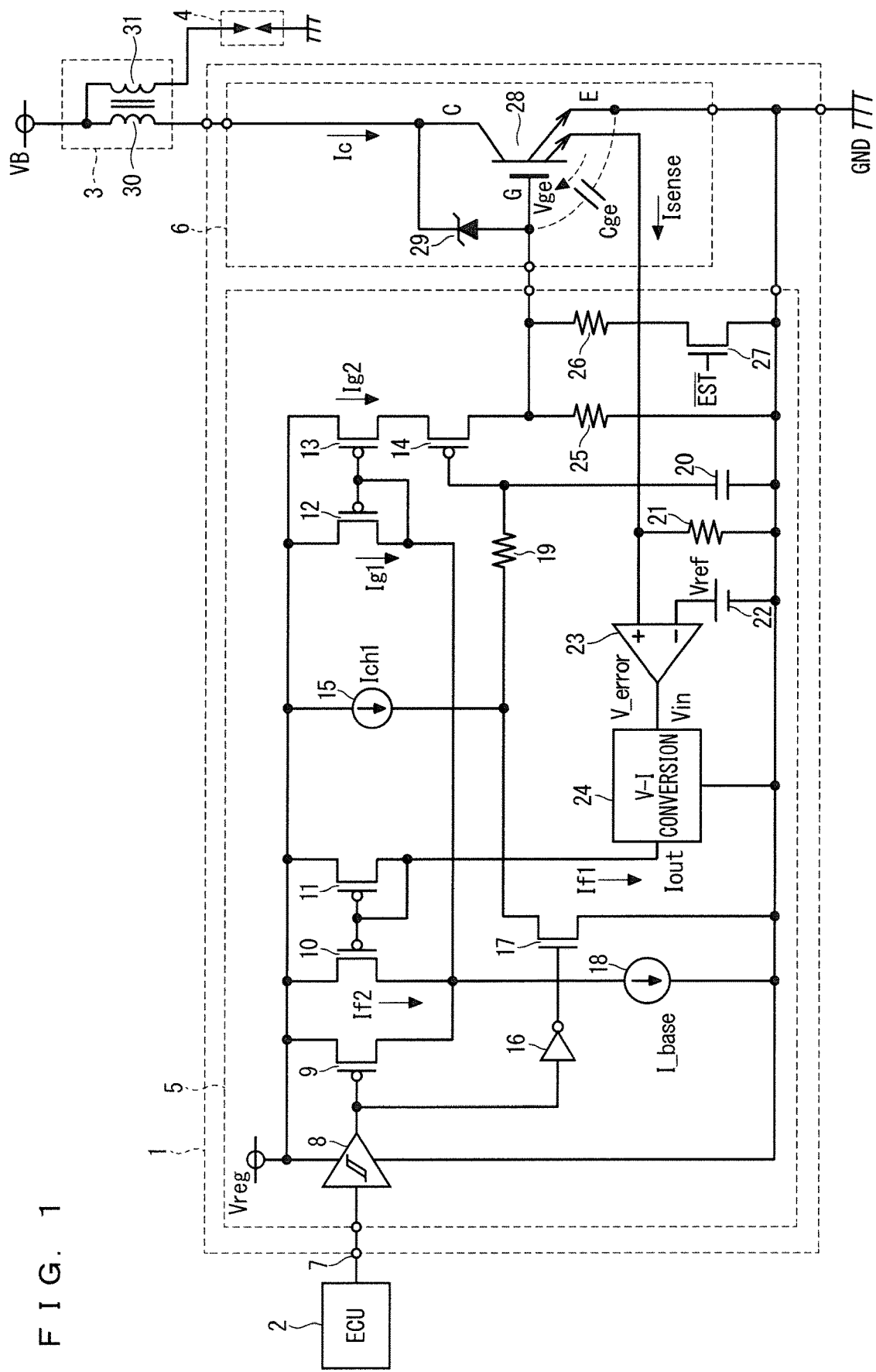
FIG. 1 is a block diagram illustrating an example of a configuration of a power semiconductor device according to a first embodiment.

FIG. 1 is a block diagram showing an example of a configuration of a power semiconductor device 1 according to a first embodiment, and shows an example of an ignition system including the power semiconductor device 1.

An ignition coil 3 includes a primary coil 30 and a secondary coil 31. One end of the primary coil 30 is connected to a power source VB, and the other end is connected to the power semiconductor device 1. One end of the secondary coil 31 is connected to the power source VB, and the other end is connected to a spark plug 4.

The power semiconductor device 1 includes a semiconductor switching element 6 having an Insulated Gate Bipolar Transistor (IGBT) 28 that energizes and cuts off the current flowing through the primary coil 30 of the ignition coil 3, and a control circuit 5 that controls the drive of the IGBT 28. The control circuit 5 is connected to the ECU 2 via a control terminal 7, and controls the drive of the IGBT 28 according to a control signal input from the ECU 2.

Figure 2:
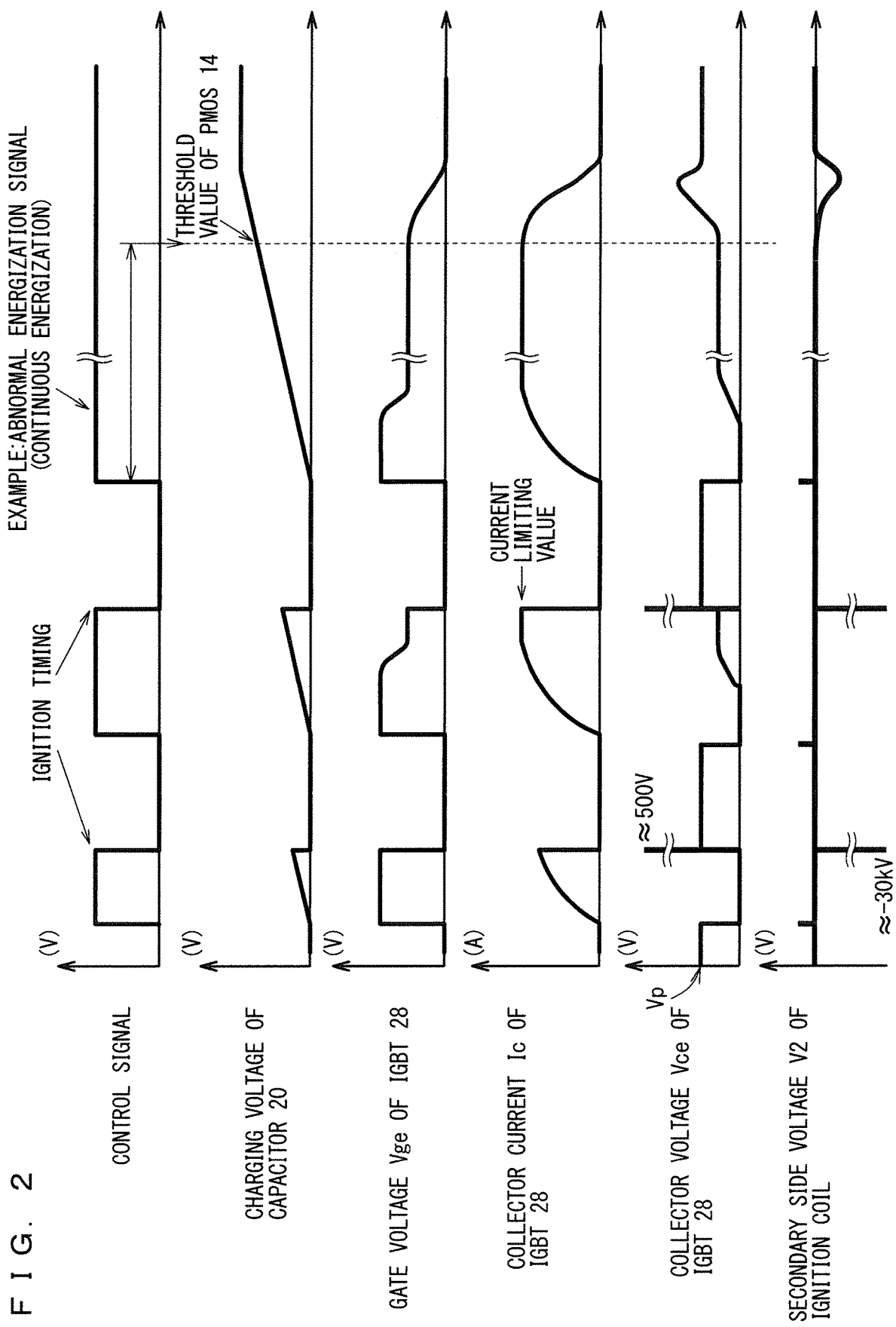
FIG. 2 is a timing chart showing an example of the operation of the power semiconductor device according to the first embodiment.

Next, the operation of the power semiconductor device 1 will be described with reference to the timing chart shown in FIG. 2.

First, the control signal (ON signal), input from the ECU 2 via the control terminal 7, is waveform-shaped by a Schmitt trigger circuit 8, and turns off the PMOS 9 as well as the NMOS 27. Here, PMOS refers to a P-type Metal-Oxide-Semiconductor Field Effect Transistor (MOSFET). Also, NMOS refers to an N-type MOSFET.

Also, a current mirror circuit composed of a PMOS 12 and PMOS 13 operates. The reference side current Ig1 of the current mirror circuit is a value obtained by subtracting a current If2 from an output current Ib1 of a constant current source 18. A current Ig2 corresponding to the mirror ratio of the current mirror circuit with respect to the reference side current Ig1 is an output current of the current mirror circuit.

The NMOS 27 is in the off state; therefore, the current Ig2 does not flow through a resistor 26. A resistor 25 has a resistance of several tens of thousands ohm, and the resistor 25 contributes most as the load impedance of the current mirror circuit. Therefore, most of the current Ig2 output from the current mirror circuit flows through the resistor 25. As a result, the gate voltage of the IGBT 28 is generated and the IGBT 28 is driven. At this point, a collector current Ic (load current) as shown in FIG. 2 flows through the primary coil 30 and the IGBT 28 according to a time constant determined by the inductance of the primary coil 30 of the ignition coil 3 and wiring resistance.

Next, when a control signal (OFF signal) is input from the ECU 2 via the control terminal at the timing when the spark plug 4 is desired to be ignited, the control signal is waveform-shaped by the Schmitt trigger circuit 8, and turns on the PMOS 9 as well as the NMOS 27. As a result, the operation of the current mirror circuit composed of the PMOS 12 and the PMOS 13 is stopped, and the current Ig2 is not output from the current mirror circuit. Then, the electric charge accumulated in the gate of the IGBT 28 is discharged through the resistor 25 and the resistor 26 in an extremely short time, so that the collector current Ic flowing through the IGBT 28 is rapidly cut off.

When the collector current Ic is cut off, a change in the interlinkage magnetic flux is induced in the ignition coil 3, and induces a high voltage depending on the winding number ratio is induced toward the secondary coil 31. As a result, a discharge is generated in the spark plug 4. At this point, the IGBT 28 is fixed by the withstand voltage (for example, 500V or 700V) of the clamp Zener diode 29 provided between the collector and the gate to prevent dielectric breakdown and a discharge is generated in the spark plug 4 by an active clamp operation where the gate voltage is self-biased by the leakage current from the clamp Zener diode 29.

The control circuit 5 has a current limiting function for preventing the ignition coil 3 from melting due to an overcurrent of the collector current Ic, suppressing the demagnetization of the magnet for adjusting the transformer (magnetic resistance), and suppressing the magnetic saturation of the core material. That is, the current limiting function is a protection function for preventing a collector current Ic exceeding a certain level from flowing. Here, the current value set to the collector current Ic to implement the current limiting function is defined as the "current limiting value".

When the collector current Ic reaches the current limiting value, the collector current Ic is controlled so as not to be equal to or greater than the current limit value, and the gate voltage Vge of the IGBT 28 is lowered. Such control is referred to as negative feedback control by detecting the collector current Ic.

Specifically, a sense current Isense of the IGBT 28 flows through the resistor 21 of the control circuit 5, and a voltage corresponding to the collector current Ic of the IGBT 28 is generated in the resistor 21. The voltage generated in the resistor 21 is compared with the voltage Vref of the reference voltage source 22 by an amplifier 23, and a current If1 corresponding to the difference between the two is output from a V-I conversion circuit 24. The current If1 is output as a current If2 according to the mirror ratio by the current mirror circuit composed of the PMOS 10 and the PMOS 11. When the current If2 flows into the constant current source 18, the current Ig2 generated by the current source composed of the PMOS 12 and the PMOS 13 fluctuates. As the collector current Ic increases, the current Ig2 decreases and the voltage generated by the resistor 25 decreases. Therefore, the gate voltage of the IGBT 28 decreases, and the increase in the collector current Ic is suppressed. In this manner, it acts like the negative feedback operation for the collector current Ic, thereby, limiting the collector current Ic to a constant value.

Here, the over-energization cutting-off function with a gradual cutting-off function of the control circuit 5 will be described. The over-energization cutting-off function with a gradual cutting-off function is a function that integrates a function (over-energization cutting-off function) that self-cuts the collector current Ic when an abnormal energization signal (continuous energization) is input to the power semiconductor device 1 as a control signal and a function (gradual cutting-off function) that gradual attenuates the gate voltage Vge of the IGBT 28 and gradually cuts off the collector current Ic during self-cutting.

A circuit that implements the over-energization cutting-off function with the gradual cutting-off function includes a constant current source 15 (first constant current source) connected to the circuit internal power source Vreg, an RC integrating circuit consisting of the resistor 19 and capacitor 20, an NMOS 17 (second transistor), which is a switching element for switching between charge and discharge of the RC integrating circuit, and a PMOS 14 (first transistor), which is a switching element for self-cutting.

When the control signal (ON signal) is input to the control terminal 7, the NMOS 17 is turned off and the capacitor 20 is charged by the constant current source 15. On the other hand, when the control signal (OFF signal) is input to the control terminal 7, the NMOS 17 is turned on, and the charge accumulated in the RC integrating circuit is discharged to GND via the NMOS 17.

Next, the over-energization cutting-off function with a gradual cutting-off function will be described with reference to FIG. 2.

When the control signal (ON signal) is input to the control terminal 7, the NMOS 17 is turned off and the capacitor 20 is charged by the constant current source 15. That is, as the energization time of the control signal (ON signal) becomes longer, the charging voltage of the capacitor 20 rises.

When the charging voltage of the capacitor 20 rises and the source (S)-gate (G) voltage of the PMOS 14 becomes equal to or lower the threshold value, the PMOS 14 starts the OFF operation. The start timing of the OFF operation of the PMOS 14 corresponds to the start timing of the operation of the over-energization cutting-off function. As the capacitor 20 is further charged, the PMOS 14 is gradually turned off and the current Ig2 for driving the IGBT 28 is gradually suppressed. As a result, the gate voltage Vge of the IGBT 28 is gradually attenuated, so that the collector current Ic can be gradually cut off.

From the above, the start timing of the operation of the over-energization cutting-off function can be determined by the threshold voltage of the PMOS 14. Further, the gradual cutting-off time can be determined by the accumulated charge (charge time) of the capacitor 20. The gradual cutting-off by several millimeters to several tens of milliseconds order is ensured by selecting the capacitor capacity and charging current. As described above, the over-energization cutting-off function and the gradual cutting-off function can be implemented by one capacitor 20; therefore, the control circuit 5 composing the power semiconductor device 1 can be downsized and reduced in cost. Downsizing and cost reduction of the control circuit 5 contribute to downsizing and cost reduction of the power semiconductor device 1.

The configuration of the circuit that implements the over-energization cutting-off function with the gradual cutting-off function described above is an example, and other configurations may be used as long as the same effect can be obtained. Further, it is not limited to MOS transistor, and bipolar transistors or the like may be adopted.

Figure 3:
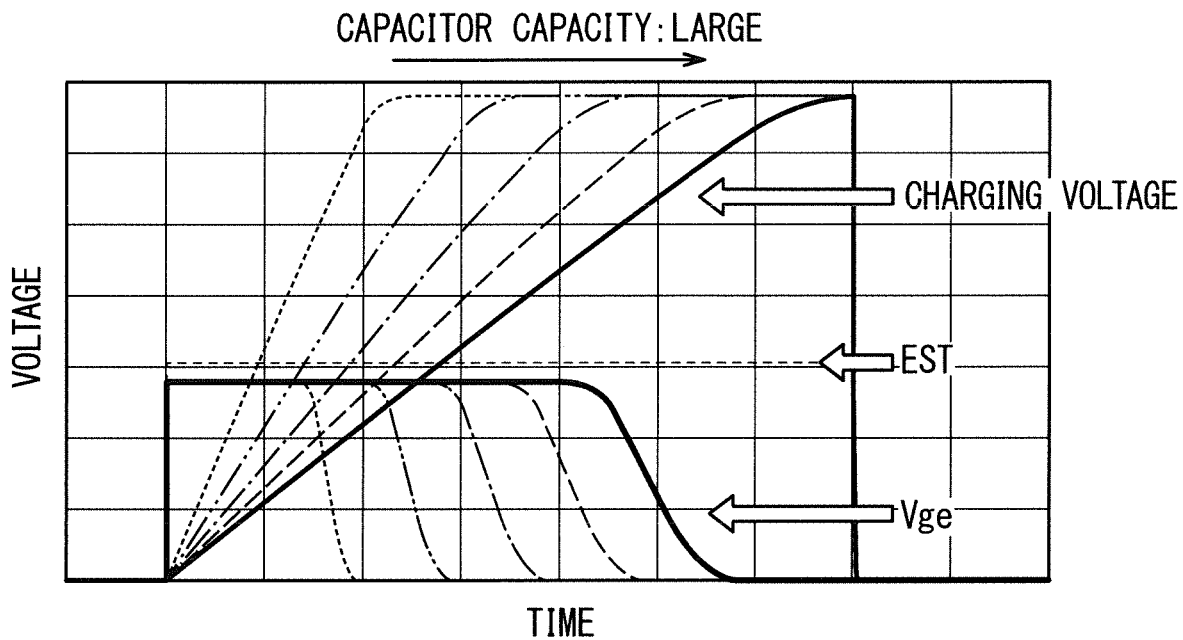
FIG. 3 is a graph showing the relationship between the gate voltage of an IGBT 28 and the capacity of a capacitor 20 according to the first embodiment.
Figure 4:
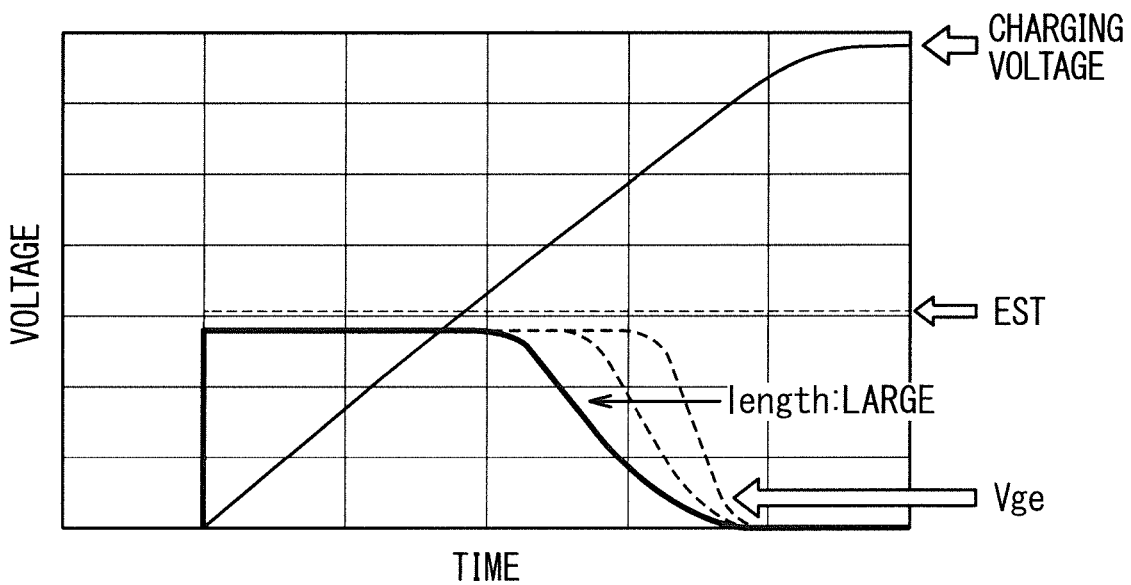
FIG. 4 is a graph showing the relationship between the gate voltage of the IGBT 28 and the channel length of a PMOS 14 according to the first embodiment.

FIG. 3 shows the relationship between the gate voltage Vge of the IGBT 28 and the capacitance of the capacitor 20. FIG. 4 shows the relationship between the gate voltage Vge of the IGBT 28 and the channel length (length) of the PMOS 14. FIG. 5 shows the relationship between the gate voltage Vge of the IGBT 28 and the channel width (width) of the PMOS 14.

As shown in FIGS. 3 to 5, the cutting-off speed of the gate voltage Vge of the IGBT 28 depends on the charging speed of the capacitor 20 and the element size (channel length, channel width) of the PMOS 14. Therefore, the cutting-off speed (gradual cutting-off time) of the gate voltage Vge of the IGBT 28 during the self-cutting operation can be easily adjusted by changing the capacitance of the capacitor 20 or the element size (channel length, channel width) of the PMOS 14. That is, the controllability of the gradual cutting-off time is improved.

As another method other than the one described above, for example, ratio adjustment by the current mirror circuit or the like allows to arbitrarily design the gradual cutting-off time by, and the method is not limited to a specific method.

Second Embodiment

Figure 6:
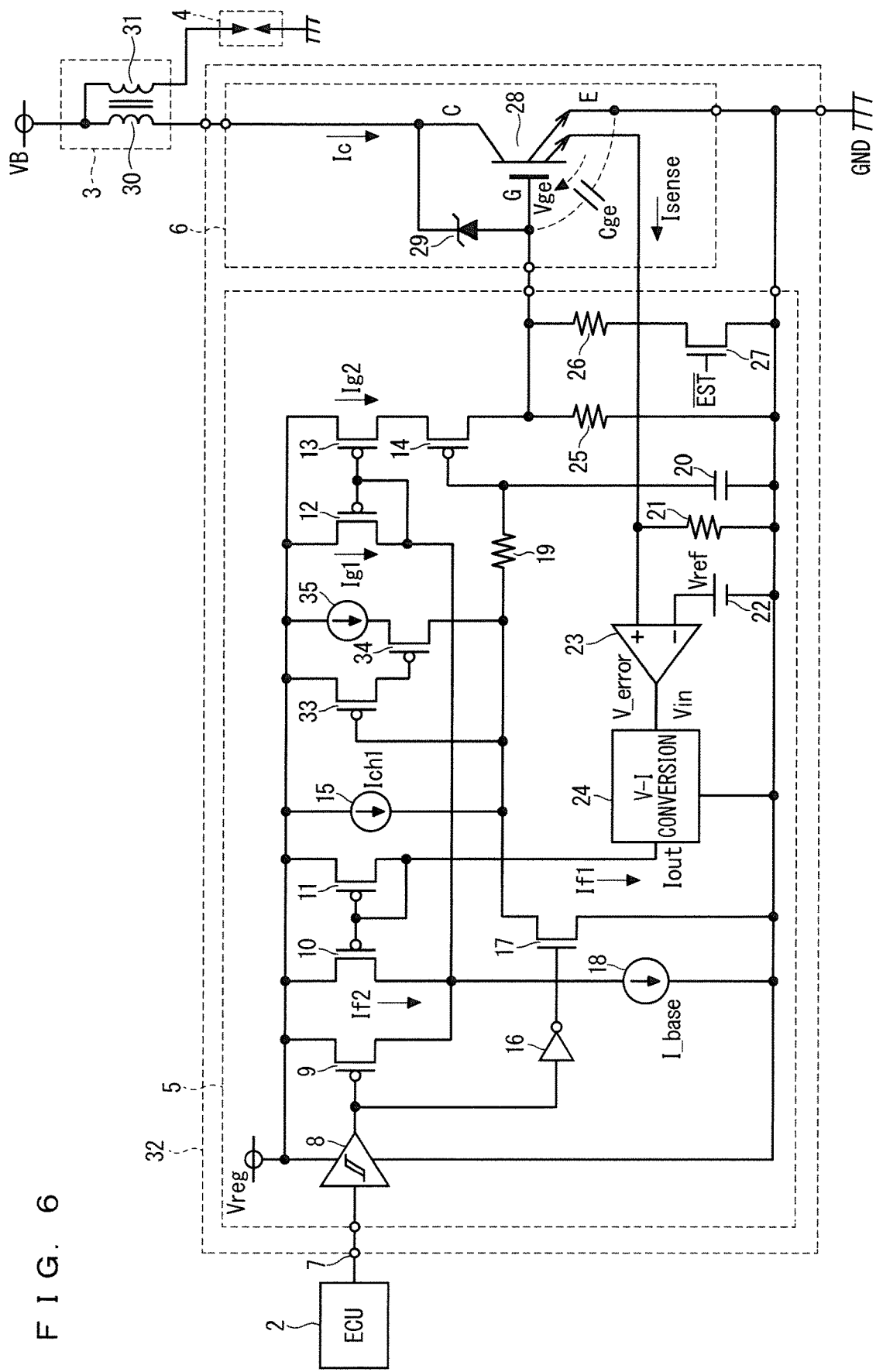
FIG. 6 is a block diagram illustrating an example of a configuration of a power semiconductor device according to a second embodiment.

FIG. 6 is a block diagram showing an example of a configuration of a power semiconductor device 32 according to the second embodiment, and shows an example of an ignition system including the power semiconductor device 32.

In the power semiconductor device 1 according to the first embodiment shown in FIG. 1, there remains a problem that the only gradual cutting-off time cannot be adjusted (see FIG. 3) because the start timing of the operation of the over-energization cutting-off function and the gradual cutting-off time are linked. Further, although the gradual cutting-off time can be adjusted by changing the element size (channel length, channel width) of the PMOS 14, there remains a problem that the degree of freedom in design is low due to the manufacturing variation and the limitation of the element size of the PMOS 14.

As a measure to address such a problem, in the second embodiment, as shown in FIG. 6, a circuit for changing the charging speed composed of a PMOS 33 (third transistor), PMOS 34 (fourth transistor), and constant current source 35 (second constant current source) is provided between the constant current source 15 and the resistor 19. The other configuration is the same as that of the power semiconductor device 1 according to the first embodiment shown in FIG. 1, and detailed description thereof will be omitted here.

Figure 7:
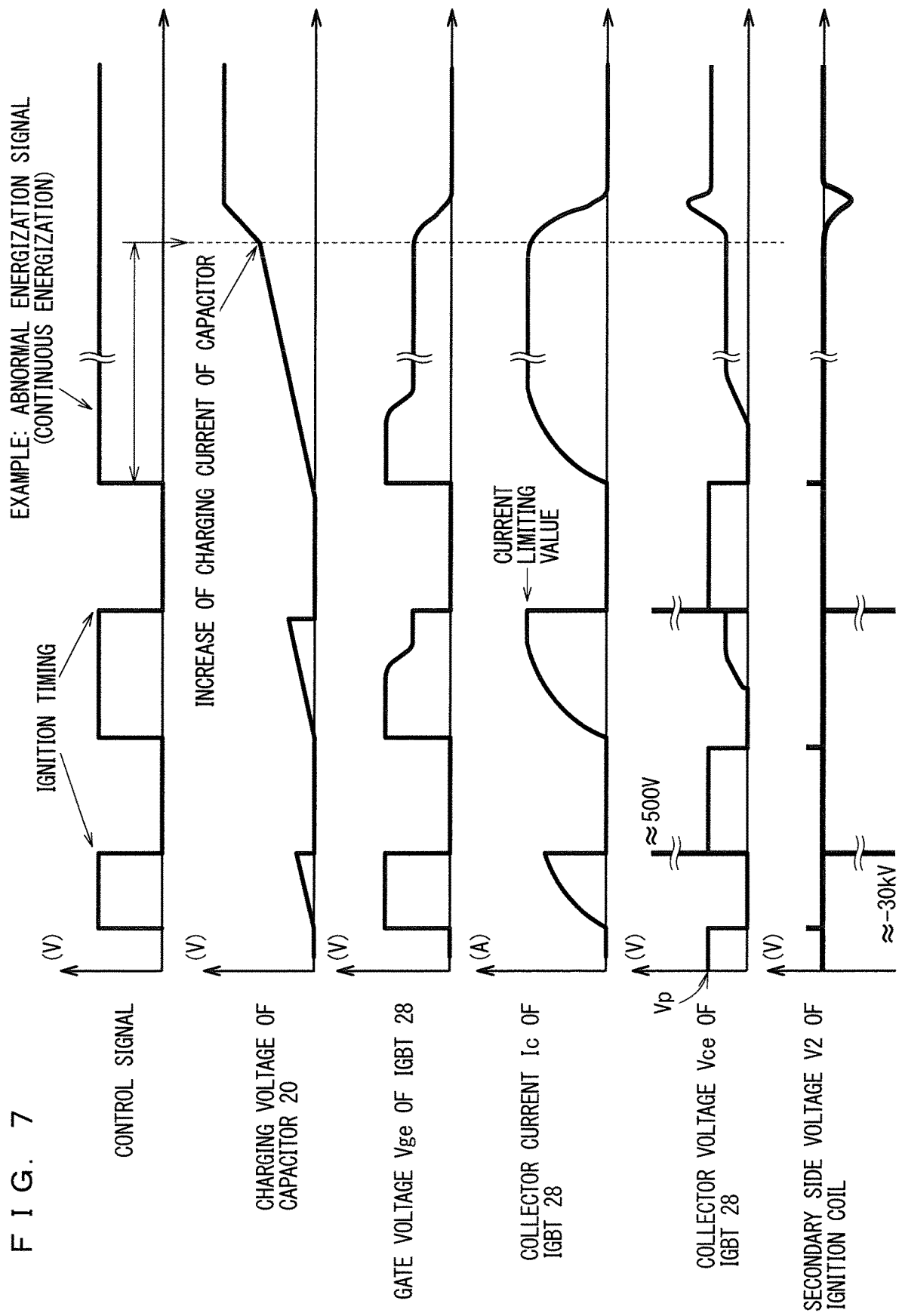
FIG. 7 is a timing chart showing an example of the operation of the power semiconductor device according to the second embodiment.

Next, the operation of the power semiconductor device 32 will be described with reference to FIG. 7.

When the charging of the capacitor 20 by the constant current source 15 starts and the voltage between the source (S) and the gate (G) of the PMOS 33 becomes equal to or lower than the threshold value (the start of the operation of the over-energization cutting-off function), the output of the PMOS 33 becomes the low level and the capacitor 34 is turned on. When the PMOS 34 is turned on, charging of the capacitor 20 by the constant current source 35 in addition to the constant current source 15 is started, so that the rising in the charging voltage of the capacitor 20 is accelerated. As a result, the cutting-off speed (ON→OFF) of the PMOS 14 can be adjusted, so that the cutting-off speed of the gate voltage Vge of the IGBT 28 can be adjusted. That is, the gradual cutting-off time can be adjusted without changing the start timing of the operation of the over-energization cutting-off function.

Third Embodiment

Figure 8:
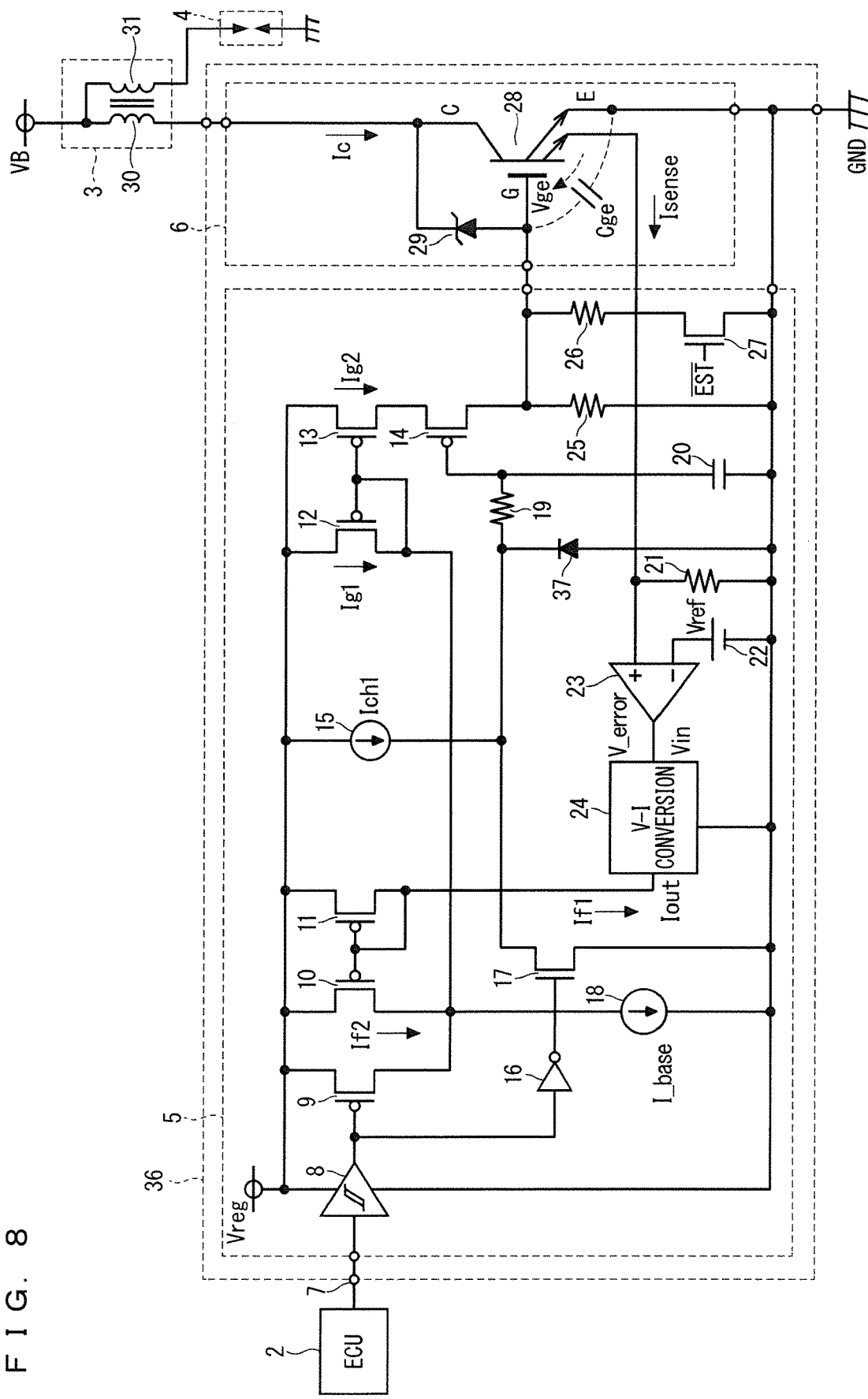
FIG. 8 is a block diagram illustrating an example of a configuration of a power semiconductor device according to a third embodiment.

FIG. 8 is a block diagram showing an example of a configuration of a power semiconductor device 36 according to the third embodiment, and shows an example of an ignition system including the power semiconductor device 36.

Figure 9:
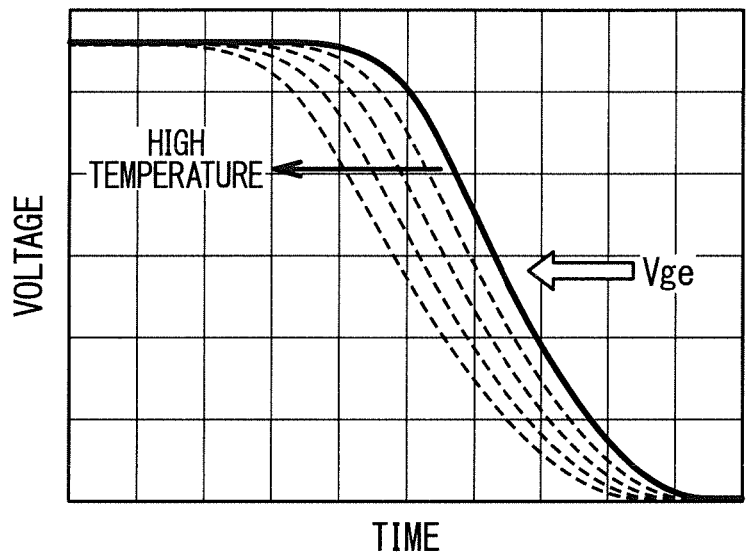
FIG. 9 is a graph showing the temperature characteristics of the over-energization cutting-off function according to the third embodiment.

Typically, a capacitor has a characteristic that its capacitance decreases at a high temperature. Therefore, in the power semiconductor device 1 according to the first embodiment shown in FIG. 1, the start timing of the operation of the over-energization cutting-off function fluctuates due to the temperature characteristic of the static capacitance of the capacitor 20 (see FIG. 9), causing a problem in the deterioration of controllability of the over-energization cutting-off function.

As a measure to address such a problem, in the third embodiment, as shown in FIG. 8, a temperature compensation circuit is provided in which the cathode terminal of a temperature compensation diode 37 is connected between the constant current source 15 and the resistor 19, and the anode of the temperature compensation diode 37 is connected GND. The other configuration is the same as that of the power semiconductor device 1 according to the first embodiment shown in FIG. 1, and detailed description thereof will be omitted here. The temperature compensation circuit shown in FIG. 8 is an example.

Figure 10:
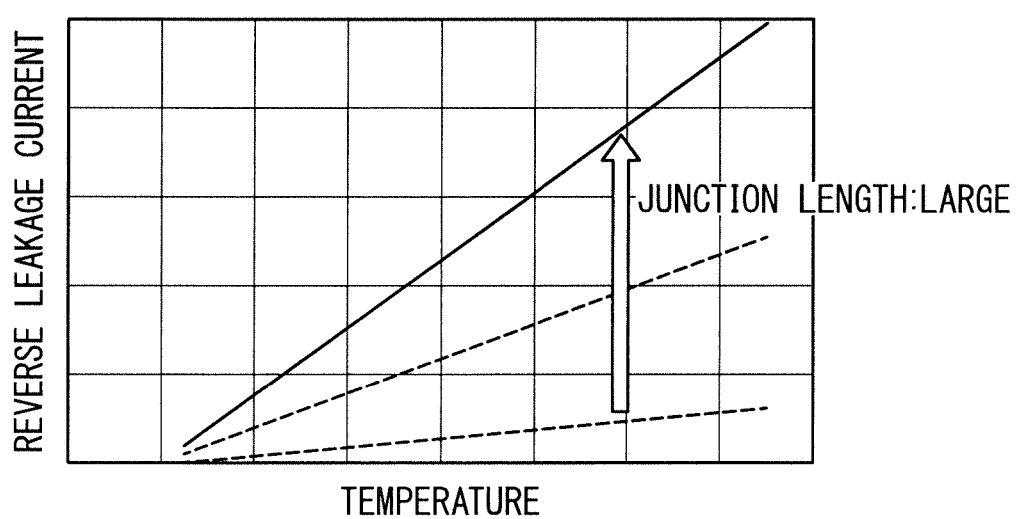
FIG. 10 is a graph showing the temperature characteristics of the reverse leakage current of a temperature compensation diode 37 according to the third embodiment.

FIG. 10 is a graph showing the temperature characteristics of the reverse leakage current of a temperature compensation diode 37.

A part of the current output from the constant current source 15 flows to GND as a reverse leakage current of the temperature compensation diode 37. As shown in FIG. 10, the reverse leakage current of the temperature compensating diode 37 increases as the temperature rises, so that the charging current of the capacitor 20 decreases (the charging speed is adjusted). As a result, when the capacitance of the capacitor 20 decreases at high temperature, the charging current also decreases, so that fluctuations in the start timing of the operation of the over-energization cutting-off function can be suppressed.

It is desirable that the temperature compensation diode 37 suppresses the reverse leakage current with the junction length adjusted. Further, the temperature compensation diode 37 may be any diode such as a Zener diode or a Schottky barrier diode as long as the same effect as described above can be obtained.

In the above, while the case where the temperature compensation circuit is applied to the power semiconductor device 1 according to the first embodiment shown in FIG. 1 has been described, the same effect as above can also be obtained with the application of the temperature compensation circuit to the power semiconductor device 32 according to the second embodiment shown in FIG. 6.

In the present disclosure, the embodiments can be combined, appropriately modified or omitted, without departing from the scope of the disclosure.

While the disclosure has been shown and described in detail, the foregoing description is in all aspects illustrative and not restrictive. It is understood that numerous other modifications not having been described can be devised without departing from the scope of the disclosure.

EXPLANATION OF REFERENCE SIGNS 1 power semiconductor device, 2 ECU, 3 ignition coil, 4 spark plug, 5 control circuit, 6 semiconductor switching element, 7 control terminal, 8 Schmitt trigger circuit, 9 to 14 PMOS, 15 constant current source, 16 NOT circuit, 17 NMOS, 18 constant current source, 19 resistor, 20 capacitor, 21 resistor, 22 reference voltage source, 23 amplifier, 24 V-I conversion circuit, 25, 26 resistor, 27 NMOS, 28 IGBT, 29 clamp Zener diode, 30 primary coil, 31 secondary coil, 32 power semiconductor device, 33, 34 PMOS, 35 constant current source, 36 power semiconductor device, 37 temperature compensation diode.

The invention claimed is:

1. A power semiconductor device comprising:
a semiconductor switching element configured to control a current flowing through a primary coil composing an ignition coil; and
a control circuit configured to control drive of the semiconductor switching element, wherein
the control circuit includes
a first constant current source,
a first transistor with an input terminal thereof connected to the first constant current source and an output terminal thereof connected to a control terminal of the semiconductor switching element,
a resistor with one end thereof connected to a control terminal of the first transistor and an other end thereof connected to the first constant current source,
a capacitor with one end thereof connected to the control terminal of the first transistor and an other end thereof grounded, and
a second transistor with an input terminal thereof connected to the resistor, an output terminal thereof grounded, and a control terminal thereof connected to a Schmitt trigger circuit.

2. The power semiconductor device according to claim 1, wherein
the control circuit includes
a third transistor with an input terminal thereof connected to the first constant current source and a control terminal thereof connected between the other end of the resistor and the first constant current source,
a fourth transistor with a control terminal thereof connected to an output terminal of the third transistor and an output terminal thereof connected between the other end of the resistor and the first constant current source, and
a second constant current source connected to an input terminal of the fourth transistor.

3. The power semiconductor device according to claim 1, wherein
the control circuit includes a diode with a cathode thereof connected between the other end of the resistor and the first constant current source and an anode thereof grounded.

4. The power semiconductor device according to claim 2, wherein the control circuit includes a diode with a cathode thereof connected between the other end of the resistor and the first constant current source and an anode thereof grounded.

* * * * *